(12) United States Patent
Nakahata

(10) Patent No.: US 6,828,182 B2
(45) Date of Patent: Dec. 7, 2004

(54) EPITAXIAL THIN FILM FORMING METHOD

(75) Inventor: Takumi Nakahata, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 309 days.

(21) Appl. No.: 10/225,308

(22) Filed: Aug. 22, 2002

(65) Prior Publication Data

US 2003/0162365 A1 Aug. 28, 2003

(30) Foreign Application Priority Data

Feb. 22, 2002 (JP) .................................. 2002-045822

(51) Int. Cl.⁷ .................. H01L 21/302; H01L 21/461
(52) U.S. Cl. .................. 438/200; 438/503; 438/689
(58) Field of Search ............................ 438/200, 503, 438/689, 788

(56) References Cited

U.S. PATENT DOCUMENTS

| | | | |
|---|---|---|---|
| 6,316,290 B1 * | 11/2001 | Wensel ..................... | 438/118 |
| 6,703,290 B2 * | 3/2004 | Boydston et al. ........... | 438/503 |
| 6,724,019 B2 * | 4/2004 | Oda et al. ................. | 257/195 |
| 2003/0109095 A1 * | 6/2003 | Boydston et al. ........... | 438/200 |
| 2004/0137732 A1 * | 7/2004 | Frayssinet et al. .......... | 438/689 |

FOREIGN PATENT DOCUMENTS

| | | |
|---|---|---|
| JP | 4-74415 | 3/1992 |
| JP | 4-074415 | 3/1992 |

OTHER PUBLICATIONS

Nakahata, Takumi et al., "Formation of Selective Epitaxially Grown Silicon with a Flat Edge by Ultra–high Vacuum Chemical Vapor Deposition", Journal of Crystal Growth 233 (2001), pp. 82–87, Sep. 4, 2001.

* cited by examiner

Primary Examiner—Michael Lebentritt
(74) Attorney, Agent, or Firm—Leydig, Voit & Mayer, Ltd.

(57) ABSTRACT

A method for selectively forming an epitaxial thin film on a semiconductor substrate by controlling a flow rate of a source gas supplied to a deposition ambient includes determining a relation between the growth rate of the epitaxial thin film and the gas flow rate by changing the flow rate of the gas supplied to the deposition ambient at a prescribed temperature. A mass transfer limited region, a kinetically limited region, and an intermediate region are identified. The method further includes supplying the source gas at the flow rate corresponding to the intermediate region to form the epitaxial thin film on the semiconductor substrate. Thus, a method for selectively forming a flat epitaxial thin film by controlling the growth temperature and the gas flow rate is provided.

7 Claims, 7 Drawing Sheets

EPITAXIAL THIN FILM FORMING METHOD

BACKGROUND OF THE INVENTION

1. Field of the Invention

The present invention generally relates to manufacturing methods of semiconductor devices, and more particularly to a method for selectively forming an epitaxial thin film on a semiconductor substrate.

2. Description of the Background Art

It is widely known that, when the surface of a semiconductor substrate of silicon or the like is partly provided with an insulating film, such as oxide film, or nitride film and partly exposed, an epitaxial thin film can be selectively formed exclusively on the exposed portion. A structure called an elevated source drain takes advantage of this technique to form an active region in the selectively grown epitaxial thin film. In recent years, with advancement of downsizing of semiconductor elements, conventional manufacturing methods have found difficulties in controlling threshold values critical to electric performance. This elevated source drain structure enables implementation of a transistor overcoming this problem.

When forming the epitaxial thin film selectively on the semiconductor substrate, however, a facet may be formed at the edge of the epitaxial thin film where it contacts the insulating film. Such a facet hinders formation of an active region of a predetermined depth, thereby adversely affecting delicate operations of the transistor. In addition, when the facet reaches the semiconductor substrate, a conductive layer formed on the epitaxial thin film will come into contact with the semiconductor substrate, causing a local leakage current.

Hereinafter, description is made as to why the facet is created. An oxide film having an opening is formed on a silicon substrate with a surface of (100) crystallographic plane, and an epitaxial thin film is formed of silicon to fill in the opening. According to the epitaxial growth method, it is possible to form an epitaxial thin film with the same orientation as the (100) plane of the silicon substrate. However, at a portion where the epitaxial thin film comes into contact with a sidewall of the oxide film, silicon atoms within the epitaxial thin film become disadvantageous in terms of surface free energy. To eliminate such disadvantage of the surface free energy, the epitaxial thin film produces a facet at the interface with the sidewall of the oxide film in an attempt to avoid contact with the oxide film.

A thermodynamic effect acting to minimize the surface free energy takes an important role in such facet formation. As a result, a (311) plane having a surface free energy smaller than that of the (100) plane of the epitaxial thin film to be formed is created as the facet at the edge of the epitaxial thin film where it contacts the oxide film.

In order to solve such a problem, Japanese Patent No. 2638261, for example, discloses a method for forming an epitaxial thin film of silicon using a gas source. According to the publication, at least one of the growth temperature and the partial pressure of the source gas is changed within a range of 400° C. to 800° C. and within a range where the degree of vacuum is from $1.3 \times 10^{-3}$ Pa to $1.3 \times 10^{-1}$ Pa, respectively. More specifically, the growth temperature is lowered or the flow rate of the gas material is increased within the aforementioned ranges such that the epitaxial thin film is selectively formed while creation of a facet is restrained.

When the epitaxial thin film is formed under the above-described conditions with the growth temperature decreased and the gas flow rate increased, the facet will be gradually reduced in size and will disappear under a prescribed condition. However, if the growth temperature is lowered and the gas flow rate is increased and exceeds a certain range, a bump will occur instead of the facet. The bump has a rounded shape and is formed at the surface of the epitaxial thin film near the sidewall of the oxide film. A large bump hinders formation of an active region of a predetermined depth, thereby adversely affecting the delicate operations of the transistor.

As such, in order to form a flat epitaxial thin film, it is necessary to control both the growth temperature and the gas flow rate to fall into prescribed ranges. With the conventional techniques, however, specific ranges of the growth temperature and the flow rate of the gas material ensuring formation of a flat epitaxial thin film were unclear.

SUMMARY OF THE INVENTION

Based on the foregoing, an object of the present invention is to provide a method for selectively forming a flat epitaxial thin film by controlling a growth temperature and a flow rate of a gas material.

The epitaxial thin film forming method according to the present invention controls the flow rate of the gas material supplied to a deposition atmosphere to selectively form the epitaxial thin film on a semiconductor substrate. The method includes the step of determining a relation between the growth rate of the epitaxial thin film and the flow rate of the gas material by changing the flow rate of the gas material supplied to the deposition atmosphere under a prescribed temperature condition. This step of determining the relation between the growth rate of the epitaxial thin film and the flow rate of the gas material includes the step of determining a mass transfer limited region where the growth rate of the epitaxial thin film is approximately proportional to the flow rate of the gas material, a kinetically limited region where the growth rate of the epitaxial thin film is approximately constant, and an intermediate region located between the mass transfer limited region and the kinetically limited region. The epitaxial thin film forming method further includes the step of forming the epitaxial thin film on the semiconductor substrate by supplying the gas material at the flow rate corresponding to the intermediate region.

According to the epitaxial thin film forming method as configured above, in the step of determining the relation between the growth rate of the epitaxial thin film and the flow rate of the gas material, it is possible to obtain the growth temperatures at the times when the relations between the growth rate and the flow rate of the gas material fall into the mass transfer limited region, the intermediate region and the kinetically limited region within the range of the gas flow rates changed. In addition, it is possible to obtain the flow rate at the time when the relation between the growth rate of the epitaxial thin film and the flow rate of the gas material falls into the intermediate region at the growth temperature obtained.

In the step of forming the epitaxial thin film on the semiconductor substrate, the deposition atmosphere is controlled to have the flow rate of the gas material and the growth temperature as described above. This enables formation of a flat epitaxial thin film, and accordingly, a transistor of high performance adapted to downsizing of semiconductor elements is realized.

The foregoing and other objects, features, aspects and advantages of the present invention will become more

DESCRIPTION OF THE PREFERRED EMBODIMENTS

Hereinafter, embodiments of the present invention will be described with reference to the drawings.

First Embodiment

Figure 1:
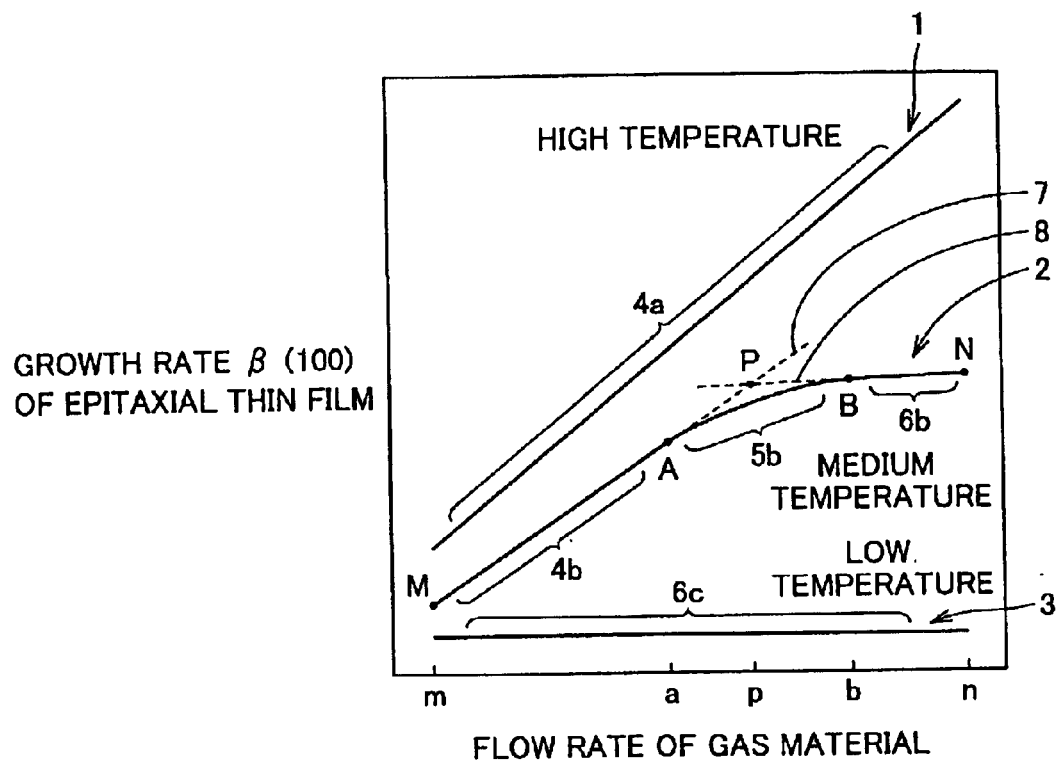
FIG. 1 shows graphs illustrating the epitaxial thin film forming method according to a first embodiment of the present invention.

Referring to FIG. 1, a relation between the growth rate $\beta(100)$ of an epitaxial thin film and the flow rate of a gas material is shown, with the vertical axis representing the growth rate $\beta(100)$ and the horizontal axis representing the gas flow rate, where the flow rate of the gas material is changed from m to n. Solid lines 1, 2 and 3 show the relations between the growth rate $\beta(100)$ and the gas flow rate in the cases where the epitaxial thin film was formed under the temperature conditions of high temperature, medium temperature and low temperature, respectively.

Solid line 1 is a straight line of monotone increase, with growth rate $\beta(100)$ being proportional to the flow rate of the gas material. This is because the growth temperature is relatively high and the epitaxial thin film is formed in accordance with the flow rate of the gas material supplied. The region indicated by solid line 1 is called a mass transfer limited region 4a.

Solid line 3 is a horizontal line, with growth rate $\beta(100)$ being constant regardless of the flow rate of the gas material. This is because the growth temperature is relatively low and the gas material supplied is unreacted and unconsumed. The region indicated by solid line 3 is called a kinetically limited region 6c.

Solid line 2, along with an increase of the gas flow rate, consists of a straight line MA of monotonous increase, a curve AB and a horizontal line BN. More specifically, when the gas flow rate is between m and a, the growth rate is proportional to the gas flow rate, while it is constant when the gas flow rate is between b and n, unaffected by the flow rate. Here, a and b represent the flow rates of the gas material corresponding to the respective points A and B. The region indicated by straight line MA of monotonous increase as part of solid line 2 is called a mass transfer limited region 4b, the region indicated by curb AB is called an intermediate region 5b, and the region indicated by horizontal line BN is called a kinetically limited region 6b.

Thus, in the case where the epitaxial thin film is formed with the gas flow rate being changed from m to n, it is at a medium growth temperature that the relation between the growth rate $\beta(100)$ and the gas flow rate falls into the intermediate region 5b. Here, the flow rate of the gas material corresponding to the intermediate region 5b is from a to b. This range includes a flow rate p corresponding to a point p in FIG. 1. Point p is a crossing between straight lines 7 and 8 which are extended from straight line MA of monotonous increase and horizontal line BN, respectively.

Figure 2:
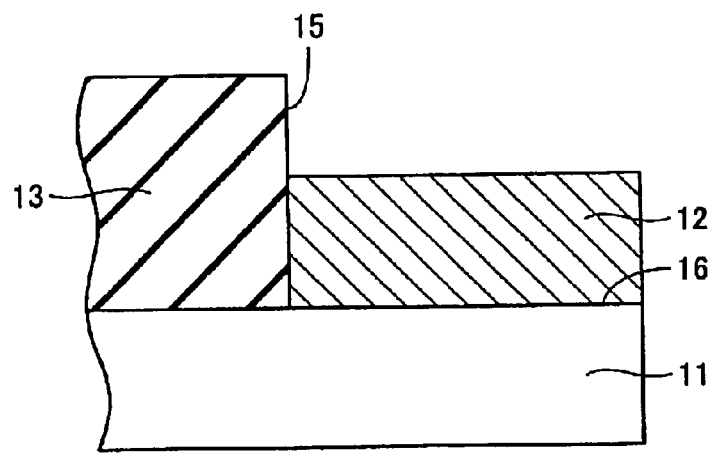
FIG. 2 is a cross sectional view showing the epitaxial thin film formed by the epitaxial thin film forming method illustrated in FIG. 1.

Referring to FIG. 2, an insulating film 13 is formed on a semiconductor substrate 11. Insulating film 13 has a concave portion 15 which reaches a surface 16 of semiconductor substrate 11. An epitaxial thin film 12 is formed to fill in the concave portion 15. Epitaxial thin film 12 has its surface formed flatly.

Epitaxial thin film 12 is formed on the (100) plane of semiconductor substrate 11 to fill in the concave portion 15, with the growth temperature controlled to a medium temperature and the flow rate of the gas supply controlled to p.

According to the epitaxial thin film forming method as described above, flat epitaxial thin film 12 can be formed on semiconductor substrate 11, since the facet or bump formation at the portion where epitaxial thin film 12 comes into contact with the sidewall of insulating film 13 is suppressed. This ensures electrical separation of semiconductor elements, and thus, a high-performance transistor in conformity with the downsizing of the semiconductor elements is accomplished.

Hereinafter, the cases where a facet or bump is created in the surface of the epitaxial thin film in the first embodiment of the present invention will be described.

Figure 3:
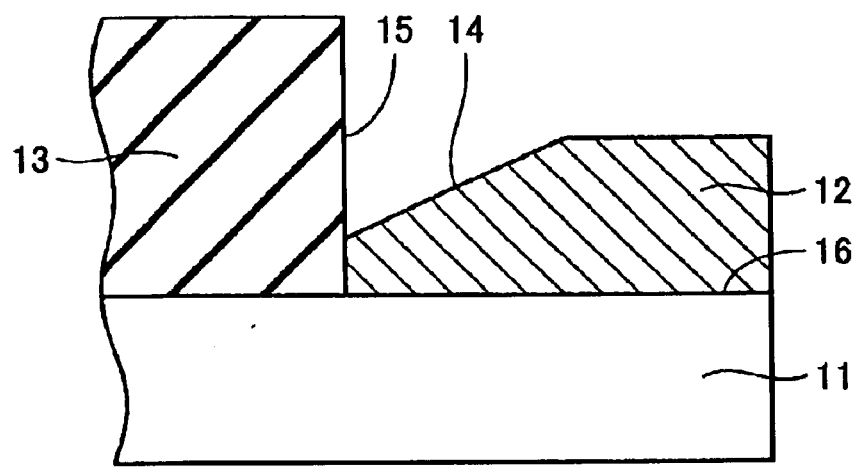
FIG. 3 is a cross sectional view showing the epitaxial thin film formed at a high growth temperature by the epitaxial thin film forming method illustrated in FIG. 1.

Referring to FIG. 3, a facet 14 is formed at a portion where epitaxial thin film 12 is in contact with the sidewall of insulating film 13. Facet 14 is composed of a (311) crystallographic plane. When the growth temperature is relatively high, admolecules of the gas material can freely move on the crystal surface of epitaxial thin film 12. Thus, facet 14 is formed with the (311) plane having the surface free energy smaller than that of the (100) plane, in accordance with the thermodynamic effect acting to minimize the surface free energy.

Figure 4:
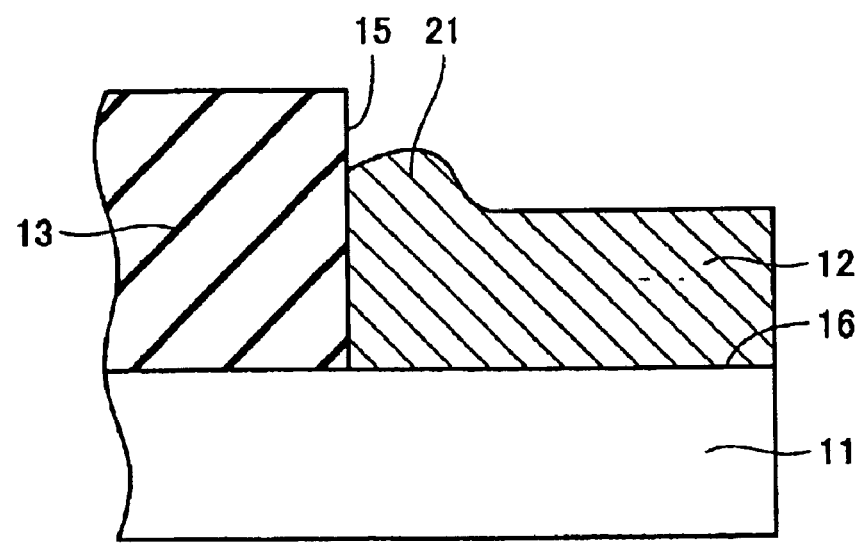
FIG. 4 is a cross sectional view of the epitaxial thin film formed at a low growth temperature by the epitaxial thin film forming method illustrated in FIG. 1.

Referring to FIG. 4, a bump 21 is formed at the portion where epitaxial thin film 12 comes into contact with the sidewall of insulating film 13. When the growth temperature is relatively low, the admolecules of the gas material cannot travel freely on the crystal surface of epitaxial thin film 12. The admolecules are unable to reach a thermodynamically optimal position where the surface free energy is minimized, so that a facet is not created. In addition, the admolecules of the gas material are supplied from the surface of insulating film 13. These admolecules are again unable to freely move on the crystal surface of epitaxial thin film 12. Thus, the density of the admolecules becomes high at the portion where the sidewall of insulating film 13 and epitaxial thin film 12 formed contact with each other, resulting in formation of bump 21.

Figure 5:
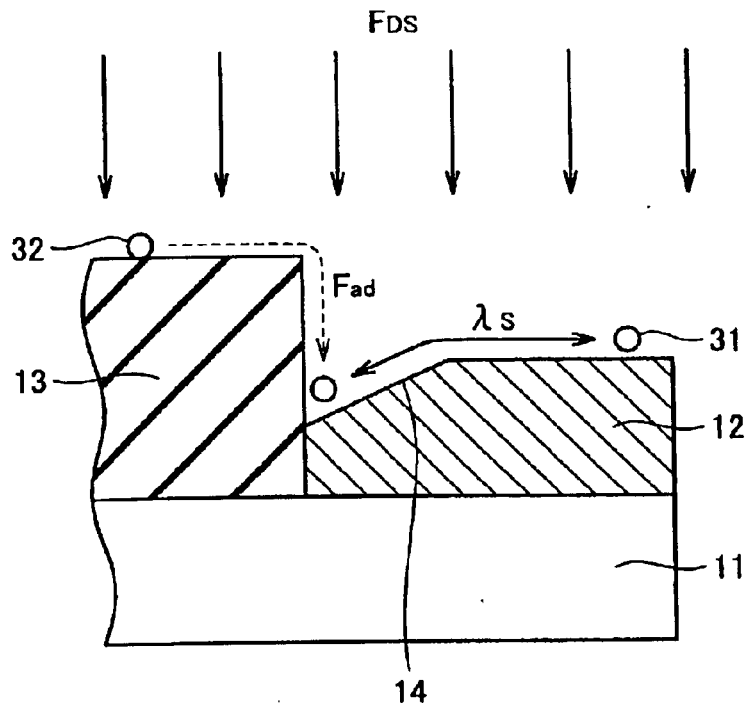
FIG. 5 is a cross sectional view of the epitaxial thin film formed by the epitaxial thin film forming method illustrated in FIG. 1 at a medium growth temperature with the gas supply at the flow rate corresponding to the mass transfer limited region.

Referring to FIG. 5, facet 14 is formed at the portion where epitaxial thin film 12 comes into contact with the sidewall of insulating film 13. There are admolecules 32 of the gas material at the surface of insulating film 13, and admolecules 31 of the gas material at the surface of epitaxial thin film 12. Since the flow rate $F_{DS}$ of the gas material being supplied is relatively small, the density of admolecules 31 at the crystal surface of epitaxial thin film 12 is low. As such, admolecules 31 of the gas material can freely migrate on the crystal surface of epitaxial thin film 12, so that the migration length $\lambda_s$ of admolecules 31 becomes long. Consequently, the (311) plane having the surface free energy smaller than that of the (100) plane is formed as facet 14 in accordance with the thermodynamic effect to minimize the surface free energy. Although admolecules 32 are supplied from insulating film 13 to the surface of facet 14, the flow rate $F_{ad}$ is relatively small. Since admolecules 32 can freely move on the crystal surface of epitaxial thin film 12, they would not prevent formation of facet 14.

Figure 6:
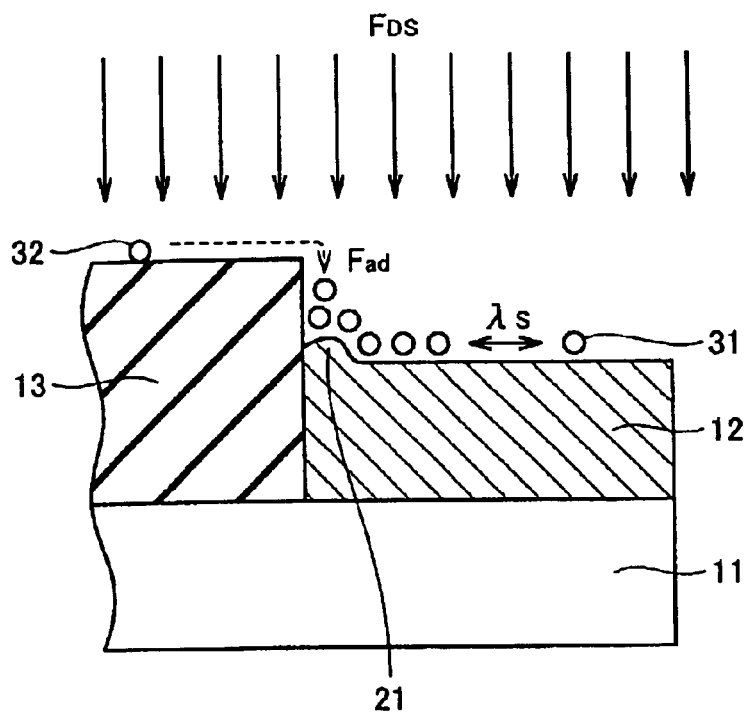
FIG. 6 is a cross sectional view of the epitaxial thin film formed by the epitaxial thin film forming method illustrated in FIG. 1 at a medium growth temperature with the gas supply at the flow rate corresponding to the kinetically limited region.

Referring to FIG. 6, bump 21 is formed at the portion where epitaxial thin film 12 contacts the sidewall of insulating film 13. There are admolecules 32 of the gas material at the surface of insulating film 13, and admolecules 31 of the gas material at the surface of epitaxial thin film 12. Since the flow rate $F_{DS}$ of the gas material being supplied is relatively great, the density of admolecules 31 on the crystal surface of epitaxial thin film 12 is high. Thus, the adsorption site (position where the admolecule is apt to react) takes place near the admolecules 31, and the migration length $\lambda_s$ of admolecules 31 becomes short. Consequently, admolecules 31 cannot travel to a position thermodynamically optical to minimize the surface free energy, and a facet is not produced. In addition, admolecules 32 are supplied from insulating film 13 to the surface of epitaxial thin film 12 with a relatively great flow rate $F_{ad}$. These admolecules 32 cannot move freely on the crystal surface of epitaxial thin film 12. Therefore, the density of admolecules at the portion where the sidewall of insulating film 13 contacts the epitaxial thin film 12 formed becomes high, so that bump 21 is created.

Hereinafter, description is given of a case where the first embodiment of the present invention is specifically carried out.

Figure 7:
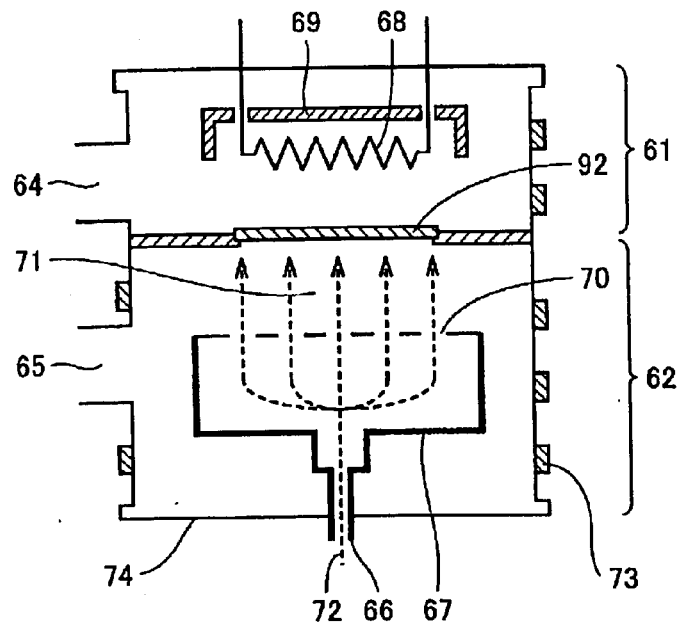
FIG. 7 shows a chemical vapor deposition (CVD) apparatus for use with the epitaxial thin film forming method illustrated in FIG. 1.

Referring to FIG. 7 showing a CVD apparatus for use in the first embodiment, a chamber 74 has an upper zone 61 and a lower zone 62 provided therein. Formed on the side surface of chamber 74 are exhaust openings 64 and 65 that are guided to the outside from upper zone 61 and lower zone 62, respectively. Exhaust openings 64 and 65 are connected to a vacuum pump (not shown). A water cooling jacket 73 is formed on the side surface of chamber 74. In the upper zone 61, a heater 68 and a reflector 69 are placed in parallel with each other to face the lower zone 62. Reflector 69 assists efficient radiation of heater 68 on a substrate. In the lower zone 62, a shower head 67 is placed which has gas nozzles 70 facing the heater 68. Shower head 67 is provided with a supply tube 66 communicating with the outside of chamber 74. The gas supplied via supply tube 66 is diffused within shower head 67 and sprayed uniformly from the gas nozzles 70. The gas is externally exhausted by the vacuum pump (not shown) from exhaust openings 64 and 65.

In the first embodiment of the present invention, a silicon substrate 92 was placed on the boundary of upper zone 61 and lower zone 62 to let the surface of silicon substrate 92 face the gas nozzles 70, and silicon substrate 92 was radiated with heater 68. Disilane gas 72 was supplied via supply tube 66, and sprayed on the surface of silicon substrate 92 through gas nozzles 70. The flow rate of disilane gas 72 was changed from 0.5 sccm to 3.0 sccm, and the silicon thin film was formed under the temperature conditions of 700° C., 650° C. and 600° C. The growth rates β(100) of the silicon thin film were measured under the respective conditions.

Figure 8:
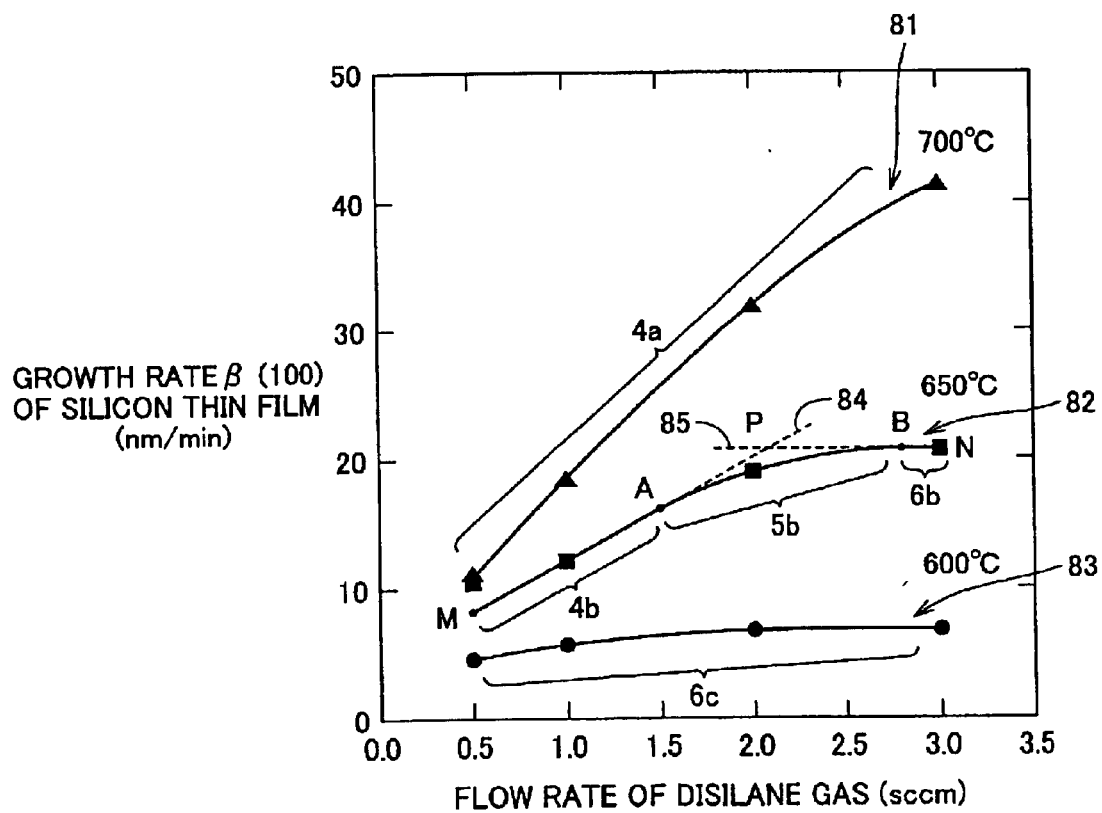
FIG. 8 shows specific graphs illustrating the epitaxial thin film forming method in FIG. 1.

FIG. 8 shows graphs corresponding to the graphs in FIG. 1. Referring to FIG. 8, a relation between growth rate β(100) of the silicon thin film and the flow rate of disilane gas 72 is shown with the vertical axis representing the growth rate β(100) and the horizontal axis representing the flow rate. Solid lines 81, 82 and 83 show the relations between growth rate β(100) and the flow rate under the temperature conditions of 700° C., 650° C. and 600° C., respectively.

When compared to the graphs in FIG. 1, solid lines 81, 82 and 83 of FIG. 8 correspond to solid lines 1, 2 and 3 of FIG. 1. Temperatures of 700° C., 650° C. and 600° C. in FIG. 8 correspond to high temperature, medium temperature and low temperature in FIG. 1.

Thus, it was at the growth temperature of 650° C. that the relation between growth rate β(100) and the flow rate of disilane gas 72 fell into the intermediate region 5b of FIG. 1. At this time, the flow rate of disilane gas 72 corresponding to intermediate region 5b was in a range between 1.5 sccm and 2.8 sccm, e.g., 2.1 sccm corresponding to a point p in FIG. 8. This point p is a crossing of straight lines 84 and 85 extended from lines MA and BN, respectively.

Figure 9:
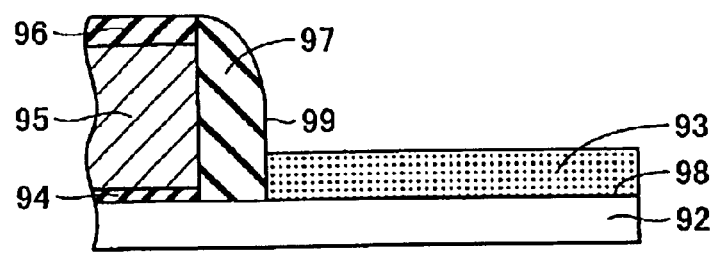
FIG. 9 is a cross sectional view showing the epitaxial thin film formed by the epitaxial thin film forming method illustrated in FIG. 1.

Referring to FIG. 9, a gate electrode 95 is formed on silicon substrate 92 with a gate oxide film 94 interposed therebetween. Further, a protective oxide film 96 is formed on gate electrode 95. A sidewall oxide film 97 is formed to contact the sidewall of gate electrode 95. A concave portion 99 is formed in sidewall oxide film 97 to reach the surface 98 of silicon substrate 92. A silicon thin film 93 is formed to fill in the concave portion 99. Silicon thin film 93 has its surface formed flatly.

In the first embodiment of the present invention, gate oxide film 94, gate electrode 95 and protective oxide film 96 were successively formed on silicon substrate 92. Sidewall oxide film 97 with concave portion 99 was formed on the sidewall of gate electrode 95, and silicon thin film 93 was formed to fill concave portion 99. At this time, the growth temperature was controlled to 650° C., and the flow rate of disilane gas 72 supplied was controlled to 2.1 sccm.

In the epitaxial thin film forming method according to the first embodiment of the present invention, the flow rate of disilane gas 72 as the gas material to be supplied to the deposition atmosphere is changed under prescribed temperature conditions, and the relation between the growth rate of the silicon thin film as the epitaxial thin film and the flow rate of disilane gas 72 is determined. Mass transfer limited regions 4a, 4b where the growth rate of the silicon thin film is approximately proportional to the flow rate of disilane gas 72, kinetically limited regions 6b, 6c where the growth rate of the silicon thin film is approximately constant, and an intermediate region 5b located between the mass transfer limited region and the kinetically limited region are determined. Disilane gas 72 is then supplied at the flow rate corresponding to the intermediate region 5b to form silicon thin film 93 on the silicon substrate 92 as the semiconductor substrate.

The gas material includes disilane as at least one kind selected from the group consisting of silane, disilane and germane. The epitaxial thin film includes silicone as at least one kind selected from the group consisting of silicon, germanium, and silicon-germanium mixed crystal. The semiconductor substrate includes silicone as at least one kind selected from the group consisting of silicon, germanium, and silicon-germanium mixed crystal.

Formed on silicon substrate 92 are gate electrode 95 and sidewall oxide film 97 as the sidewall insulating film to come into contact with the sidewall of gate electrode 95. The step of forming the epitaxial thin film on silicon substrate 92 by supplying disilane gas 72 as the gas material at the flow rate corresponding to the intermediate region 5b includes the step of forming silicon thin film 93 in contact with sidewall oxide film 97. The sidewall oxide film 97 as the sidewall insulating film includes an oxide film.

Referring to FIG. 9, according to the epitaxial thin film forming method carried out as described above, flat silicon thin film 93 was formed on silicon substrate 92, without a facet or bump produced at the interface between silicon thin film 93 formed and the sidewall of sidewall oxide film 97.

Figure 10:
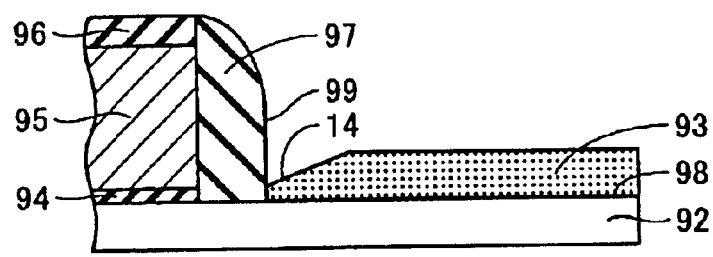
FIG. 10 is a cross sectional view showing the epitaxial thin film with a facet, formed by the epitaxial thin film forming method illustrated in FIG. 1.
Figure 11:
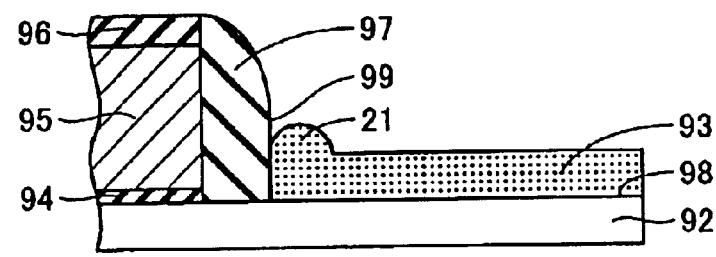
FIG. 11 is a cross sectional view showing the epitaxial thin film with a bump, formed by the epitaxial thin film forming method illustrated in FIG. 1.

FIG. 10 is a cross sectional view of the epitaxial thin film formed at the growth temperature of 700° C. with the disilane gas provided at the flow rate of 1.0 sccm. FIG. 11 is a cross sectional view of the epitaxial thin film formed at the growth temperature of 600° C. with the disilane gas provided at the flow rate of 1.0 sccm.

Referring to FIG. 10, facet 14 was formed at the portion where silicon thin film 93 formed was in contact with sidewall oxide film 97. Referring to FIG. 11, bump 21 was formed at the portion where silicon thin film 93 formed was in contact with sidewall oxide film 97.

Second Embodiment

Figure 12A:
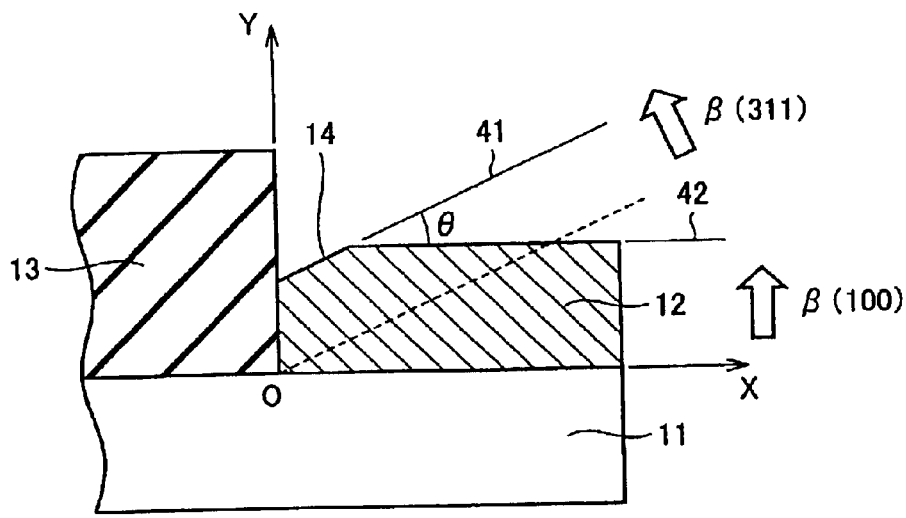
FIGS. 12A–12D are cross sectional views showing growth rates of the epitaxial thin film and the facet according to a second embodiment of the present invention.

Referring to FIG. 12A, with the Y axis representing the sidewall of insulating film 13 and the X axis representing the surface of semiconductor substrate 11, the growth rate of epitaxial thin film 12 in the (100) direction is shown as $\beta(100)$ and the growth rate of epitaxial thin film 12 in the (311) direction is shown as $\beta(311)$. Facet 14 has the (311)-oriented plane. The angle between the surface 42 of epitaxial thin film 12 and the surface 41 of facet 14 is denoted by θ, which is 25° from the orientations of the surface of semiconductor substrate 11 and the surface 41 of facet 14.

The height Y (100) of epitaxial thin film 12 and the height Y (311) of facet 14 obtained t seconds after the start of formation of epitaxial thin film 12 can be expressed by the following equations.

Figure 12B:
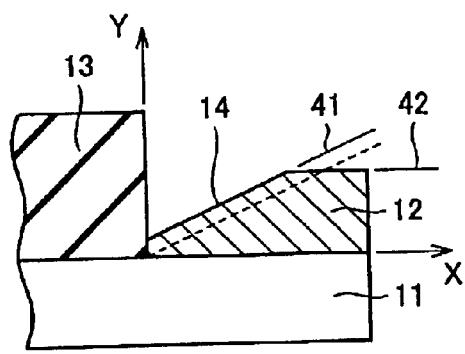

$Y(100) = \beta(100) \cdot t$ $Y(311) = (\tan \theta) \cdot X + \beta(311) \cdot t / \cos \theta$ Referring to FIG. 12B, facet 14 is formed at the portion where epitaxial thin film 12 formed contacts the sidewall of insulating film 13. At this time, the value of Y (100) when X=0 is greater than the value of Y (311), so that a ratio $\beta(311)/\beta(100)$ between the growth rate $\beta(311)$ of the epitaxial thin film in the (311) direction and the growth rate $\beta(100)$ of the epitaxial thin film in the (100) direction becomes smaller than 0.9.

Figure 12C:
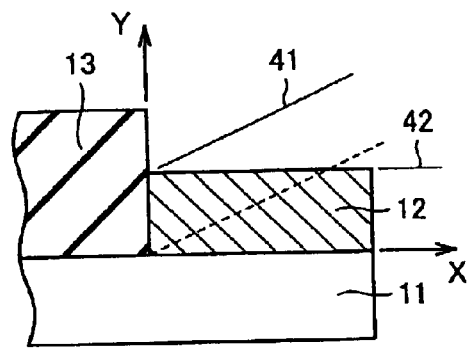

Referring to FIG. 12C, epitaxial thin film 12 has a flat surface 42. At this time, the values of Y (100) and Y (311) when X=0 are consistent with each other, so that the ratio $\beta(311)/\beta(100)$ between the growth rate $\beta(311)$ of the epitaxial thin film in the (311) direction and its growth rate $\beta(100)$ in the (100) direction becomes 0.9.

Figure 12D:
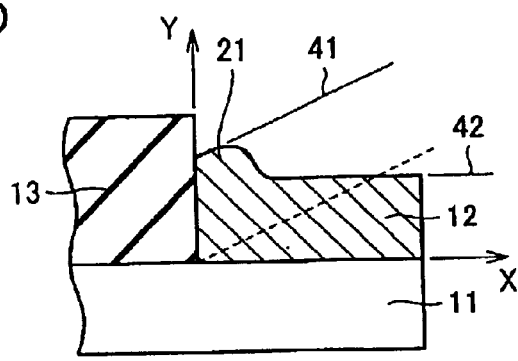

Referring to FIG. 12D, bump 21 is formed at the portion where epitaxial thin film 12 formed contacts the sidewall of insulating film 13. At this time, the value of Y (100) when X=0 is smaller than the value of Y (311). Thus, the ratio $\beta(311)/\beta(100)$ between the growth rate $\beta(311)$ of the epitaxial thin film in the (311) direction and its growth rate $\beta(100)$ in the (100) direction becomes greater than 0.9. In this case, although the value of $\beta(311)/\beta(100)$ does not represent a physically accurate relative growth rate, it is meaningful as it can conveniently indicate the shape of the surface 42 of epitaxial thin film 12.

Figure 13:
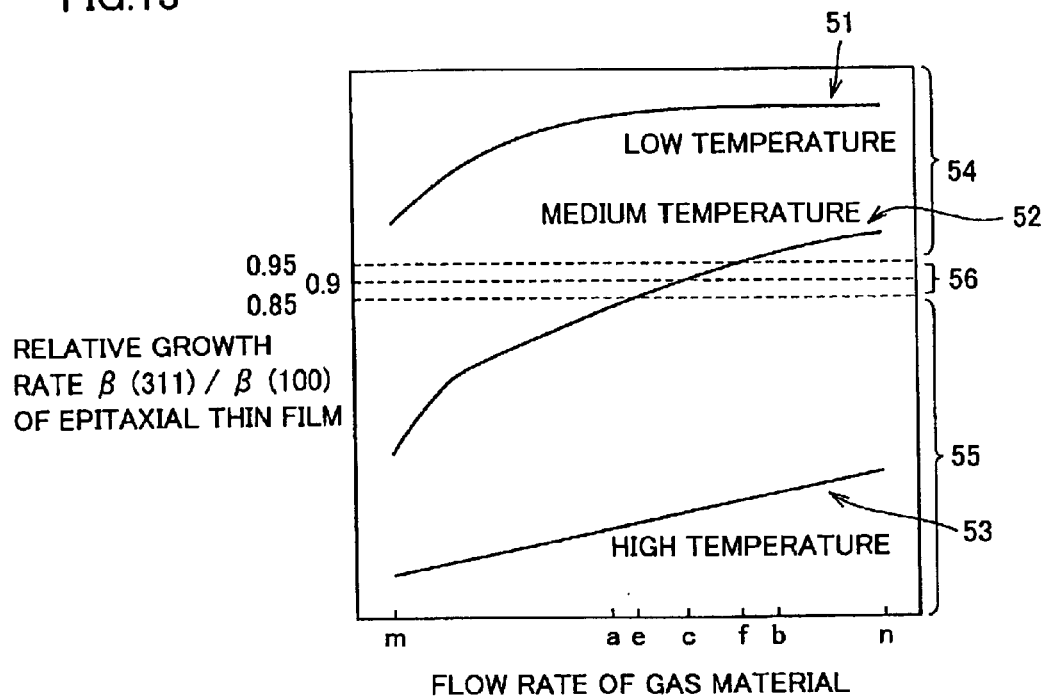
FIG. 13 shows graphs illustrating the epitaxial thin film forming method of the second embodiment.

Referring to FIG. 13, a relation between the relative growth rate $\beta(311)/\beta(100)$ of the epitaxial thin film and the flow rate of the gas material within a range where the gas flow rate is changed from m to n is shown, with the vertical axis representing the relative growth rate $\beta(311)/\beta(100)$ and the horizontal axis representing the gas flow rate. Solid lines 53, 52 and 51 represent the relations between $\beta(311)/\beta(100)$ and the gas flow rate when the epitaxial thin film is formed under the temperature conditions of high temperature, medium temperature and low temperature, respectively. A region where the value of relative growth rate $\beta(311)/\beta(100)$ is smaller than 0.85 is designated as a facet forming region 55, a region where the value of relative growth rate $\beta(311)/\beta(100)$ is not lower than 0.85 and not greater than 0.95 is designated as a flat region 56, and a region where relative growth rate $\beta(311)/\beta(100)$ is greater than 0.95 is designated as a bump forming region 54.

Solid line 53 belongs to facet forming region 55. This corresponds to the fact that, referring to FIG. 3, when epitaxial thin film 12 is formed at a high growth temperature, facet 14 is formed at the portion where the epitaxial thin film 12 formed contacts the sidewall of insulating film 13.

Solid line 51 belongs to bump forming region 54. This corresponds to the fact that, referring to FIG. 4, when epitaxial thin film 12 is formed at a low growth temperature, bump 21 is formed at the portion where epitaxial thin film 12 formed comes into contact with the sidewall of insulating film 13.

Solid line 52 belongs to facet forming region 55 when the flow rate of the gas material is small. It moves to flat region 56 and to bump forming region 54 as the gas flow rate is increased. This corresponds to the fact that, referring to FIGS. 2, 5 and 6, facet 14 is formed when the gas flow rate is small, and the surface of epitaxial thin film 12 becomes flatter as the gas flow rate is increased, and bump 21 is finally formed. The flow rate of the gas material at the time when the value of relative growth rate $\beta(311)/\beta(100)$ becomes not lower than 0.85 and not greater than 0.95 is in a range between e and f. The gas flow rate falling in this range between e and f is included in the flow rate in the range between a and b that corresponds to the intermediate region 5b in the first embodiment.

Referring to FIG. 2, epitaxial thin film 12 is formed on the (100) plane of semiconductor substrate 11 to fill the concave portion 15. At the formation of epitaxial thin film 12, the growth temperature is controlled to a medium temperature and the flow rate of the gas supply is controlled to c that is the flow rate with which the value of relative growth rate β(311)/β (100) becomes 0.9.

In such an epitaxial thin film forming method, referring to FIG. 2, flat epitaxial thin film 12 can be formed on semiconductor substrate 11, with the facet or bump formation suppressed at the portion where epitaxial thin film 12 formed contacts the sidewall of insulating film 13. This ensures electrical separation of the semiconductor elements, thereby allowing implementation of a high-performance transistor adapted to the downsizing of the semiconductor elements.

Hereinafter, description is made of the case where the second embodiment of the present invention is specifically carried out.

In the second embodiment, in the step of measuring the growth rate β(100) of the silicon thin film as in the first embodiment, the growth rate β (311) of the silicon thin film in the (311) direction was also measured.

Figure 14:
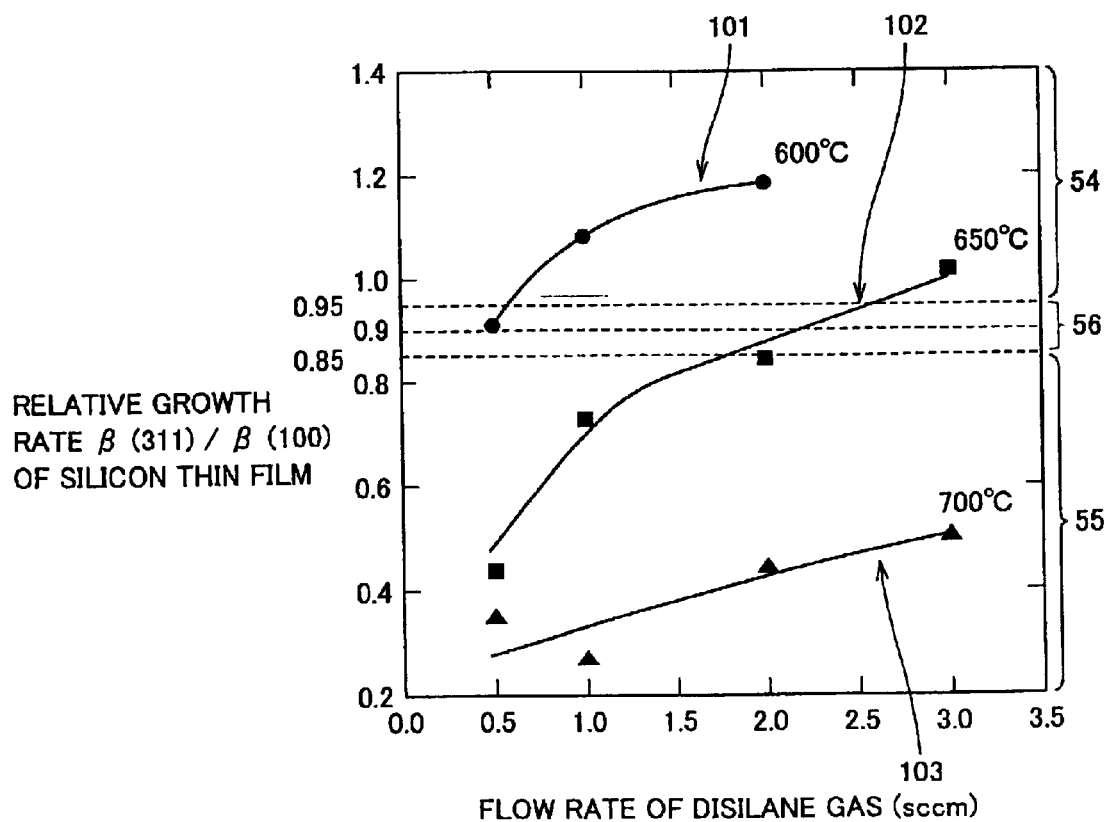
FIG. 14 shows specific graphs illustrating the epitaxial thin film forming method in FIG. 13.

The graphs shown in FIG. 14 correspond to the graphs shown in FIG. 13. Referring to FIG. 14, the relation between the relative growth rate β(311)/β(100) of the silicon thin film and the flow rate of disilane gas is shown, with the vertical axis representing the relative growth rate β(311)/β (100) and the horizontal axis representing the flow rate. Solid lines 103, 102 and 101 show their relations under the temperature conditions of 700° C., 650° C. and 600° C., respectively. It was found that the value of β(311)1/β (100) became not lower than 0.85 and not greater than 0.95 at the growth temperature of 650° C., and the flow rate of disilane gas 72 at that time was from 1.8 sccm to 2.6 sccm. It was also found that the value of β(311)1/β (100) became 0.9 when the flow rate of disilane gas 72 was 2.2 sccm. The flow rate of disilane gas 72 in the range between 1.8 sccm and 2.6 sccm fell into the range of the gas flow rate between 1.5 sccm and 2.8 sccm corresponding to the intermediate region 5b in the first embodiment.

In the second embodiment of the present invention, referring to FIG. 9, silicon thin film 93 was formed to fill in the concave portion 99, with the growth temperature controlled to 650° C. and the flow rate of disilane gas 72 controlled to 2.2 sccm.

In the epitaxial thin film forming method according to the second embodiment, the intermediate region 5b is determined where the ratio β(311)/β(100) between the growth rate β(311) of the silicon thin film 93 in the (311) direction and its growth rate β(100) in the (100) direction becomes not lower than 0.85 and not greater than 0.95.

According to the epitaxial thin film forming method thus carried out, flat silicon thin film 93 was formed on silicon substrate 92, as shown in FIG. 9, with the facet or bump formation suppressed at the portion where silicon thin film 93 formed came into contact with the sidewall of sidewall oxide film 97.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for selectively forming an epitaxial thin film on a semiconductor substrate by controlling a flow rate of a source gas supplied to a deposition ambient, comprising:

determining a relation between a growth rate of an epitaxial thin film and flow rate of a source gas by changing the flow rate of the source gas supplied to a deposition ambient at a fixed temperature, including identifying a mass transfer limited region where the growth rate of the epitaxial thin film is approximately proportional to the flow rate of the source gas, a kinetically limited region where the growth rate of the epitaxial thin film is approximately independent of the flow rate of the source gas, and an intermediate region between the mass transfer limited region and the kinetically limited region; and supplying the source gas at the flow rate corresponding to the intermediate region to form the epitaxial thin film on a semiconductor substrate.

2. The epitaxial thin film forming method according to claim 1, wherein the source gas includes at least one selected from the group consisting of silane, disilane, and germane.

3. The epitaxial thin film forming method according to claim 1, wherein the epitaxial thin film includes at least one selected from the group consisting of silicon, germanium, and a silicon-germanium mixed crystal.

4. The epitaxial thin film forming method according to claim 1, wherein the semiconductor substrate includes at least one selected from the group consisting of silicon, germanium, and a silicon-germanium mixed crystal.

5. The epitaxial thin film forming method according to claim 1, wherein a gate electrode and a sidewall insulating film in contact with a sidewall of the gate electrode are located on the semiconductor substrate, and supplying the source gas at the flow rate corresponding to the intermediate region to form the epitaxial thin film on the semiconductor substrate includes forming the epitaxial thin film in contact with the sidewall insulating film.

6. The epitaxial thin film forming method according to claim 5, wherein the sidewall insulating film is one of an oxide film and a nitride film.

7. The epitaxial thin film forming method according to claim 1, wherein determining the relation between the growth rate of the epitaxial thin film and the flow rate of the source gas includes identifying the intermediate region as having a ratio β(311)/β(100) between a growth rate β(311) of the epitaxial thin film in a (311) direction and a growth rate β(100) of the epitaxial thin film in a (100) direction as not lower than 0.85 and not greater than 0.95.

* * * * *